United States Patent [19]

Nagle et al.

[11] Patent Number: 4,921,531
[45] Date of Patent: * May 1, 1990

[54] PROCESS FOR FORMING FINE CERAMIC POWDERS

[75] Inventors: Dennis C. Nagle, Ellicott City; John M. Brupbacher, Catonsville; Leontios Christodoulou, Baltimore, all of Md.

[73] Assignee: Martin Marietta Corporation, Bethesda, Md.

[*] Notice: The portion of the term of this patent subsequent to Dec. 1, 2006 has been disclaimed.

[21] Appl. No.: 401,480

[22] Filed: Aug. 30, 1989

Related U.S. Application Data

[63] Continuation of Ser. No. 126,328, Nov. 30, 1987, abandoned, which is a continuation-in-part of Ser. No. 943,899, Dec. 19, 1986, Pat. No. 4,710,348, which is a continuation of Ser. No. 662,928, Oct. 19, 1984, abandoned.

[51] Int. Cl.$^5$ ............................................. B22F 9/00
[52] U.S. Cl. ........................................ 75/351; 75/368; 75/959; 423/297; 423/440; 423/411; 423/DIG. 12
[58] Field of Search ......... 75/0.5 A, 0.5 AA, 0.5 AC, 75/0.5 B, 0.5 BA, 0.5 BB, 0.5 BC, 63; 501/87, 96, 88, 97

[56] References Cited

U.S. PATENT DOCUMENTS

| | | | |
|---|---|---|---|
| 3,096,149 | 7/1963 | Gruber | 156/624 |
| 3,258,316 | 6/1966 | Tepper et al. | 423/250 |
| 3,726,643 | 4/1973 | Merzhanov et al. | 423/409 |
| 3,726,956 | 4/1973 | Silver | 423/4 |
| 3,961,995 | 6/1976 | Alliott | 148/32 |
| 4,161,512 | 7/1979 | Merzhanov et al. | 423/440 |
| 4,431,448 | 2/1984 | Marzhanov et al. | 75/238 |
| 4,470,956 | 9/1984 | Cheney et al. | 423/53 |
| 4,540,546 | 9/1985 | Giessen | 420/590 |
| 4,604,368 | 8/1986 | Reeve | 501/98 |
| 4,710,348 | 12/1987 | Brupbacher et al. | 420/129 |
| 4,751,048 | 6/1988 | Christodoulou et al. | 420/129 |
| 4,774,052 | 9/1988 | Nagle et al. | 420/129 |

FOREIGN PATENT DOCUMENTS 2207194 6/1974 France .
2476139 8/1981 France .
1125663 3/1962 German Democratic Rep. ... 75/0.5 AC

OTHER PUBLICATIONS

Journal of Crystal Growth, vol. 62, No. 3, Aug. 1983, North-Holland Publishing (Amsterdam, NL).
Shimada et al: "Crystal Growth of NbC by Flux Method", pp. 557–560.
Journal of Crystal Growth, vol. 33, No. 2, May 1976, North-Holland Publishing, (Amsterdam, NL).
Higashi et al: "Crystal Growth of borides and carbides of Transition metals from Molten Aluminum Solutions", pp. 207–211.
Russian Chemical Reviews, vol. 41, No. 4, 1972, (London, GB), Gurin: "Methods for the Preparation of Refractory Compounds of Transition Metals and Prospects for their Development", pp. 323–340.
Japanese Journal of Applied Physics, vol. 22, No. 9, Part I, Sep., 1983, (Tokyo, JP), Takei et al; "Growth of ErRhyBy Single Crystals by the Flux Method"; p. 1463.
Materials Research Bulletin, vol. 17, No. 11, Nov. 1982, Program Press (Clerfield, PA U.S.), Bouchacourt et al: "A New Method for Growing Crystals of $SiB_{2.8-4}$ Type Silicon Boride From a Metallic Melt", pp. 1353–1358.
Metal Progress, vol. 36, 1939, (Metals Park, OH, U.S.), McKenna: "Hard Intermetallic Compounds for New Metal Cutting Tools", pp. 152–155.

Primary Examiner—John P. Sheehan
Assistant Examiner—David W. Schumaker

[57] ABSTRACT

The present invention relates to a process for the production of fine powder materials and the products of that process. The process involves the in-situ precipitation of second phase particles, such as ceramic or intermetalics, within a metal matrix, followed by separation of the particles from the matrix to yield a powder comprising the second phase particles. Particles formed by this process are typically in the size range of 0.01 to 10 microns and have controlled morphology, narrow size distribution, well defined stoichiometery and relatively high purity. Exemplary of second phase particles formed by this process are metal borides, carbides, nitrides, oxides, silicides and beryllides, including $TiB_2$, $ZrB_2$, $VB_2$, $MoB_2$, TiC, WC, VC, TiN, $ZrSi_2$, $MoSi_2$, $Ti_5Si_3$, and $TiBe_{12}$.

47 Claims, No Drawings

PROCESS FOR FORMING FINE CERAMIC POWDERS

CROSS REFERENCE TO RELATED APPLICATIONS

This application is a continuation of Ser. No. 126,328, filed 11/30/87, now abandoned, which is a Continuation-In-Part of U.S. patent application Ser. No. 943,899, filed Dec. 19, 1986, now U.S. Pat. No. 4,710,348, which is a Continuation of U.S. patent application Ser. No. 662,928, filed Oct. 19, 1984, now abandoned.

BACKGROUND OF THE INVENTION

The present invention comprises a process for the production of fine powder materials and the products of that process. The process involves the in-situ precipitation of second phase particles, such as ceramics or intermetallics, within a solvent metal matrix, followed by the dissolution or other removal of the matrix and recovery of the second phase particles. Exemplary of second phase particles formed by this process are ceramics such as metal carbides, borides, nitrides, oxides and silicides.

FIELD OF THE INVENTION

Ceramics in general have many desireable properties which have led to their use in numerous applications. For example, the chemical stability and corrosion resistance of ceramics has resulted in their use in molten metal handling applications and as thermal barrier coatings. The favorable electrical properties of ceramics have led to their use in capacitors and varistors. Superior magnetic properties have resulted in applications such as transformers and tape recording heads. Cutting tools and abrasive wheels typically include ceramics due to their high hardness, wear resistance and high temperature properties. Similarly, such properties have led to limited use of ceramic materials in high temperature applications such as engine components and heat exchangers. The use of ceramic structural components, while limited in the past due to the relative brittleness of traditional ceramics, is increasing as new methods of processing and new ways of designing structures are developed. As a result, ceramics will in the future increasingly be considered for load bearing applications generally reserved for metals.

Ceramic components are typically fabricated from powders. Fabrication techniques which utilize ceramic starting powders include: (a) cold-pressing, followed by sintering; (b) hot-pressing; (c) slip-casting, or paste moulding, followed by sintering; (d) plasma or flame spraying; and (e) vapor plating.

The use of ceramic components fabricated by the methods listed above, especially for structural applications, requires that their properties and reliability be substantially improved. Defects which limit structural materials can nearly always be attributed to some specific event in the processing history. Most strength-limiting defects can be avoided if careful control is exercised over all aspects of processing, one of the most critical being the characteristics of the starting powder. In addition to strength, other mechanical properties, such as creep resistance, as well as electrical, magnetic, and optical properties, are all sensitive to microstructural effects induced by powder processing. In general, ideal powder characteristics for achieving high-quality ceramic components include: small particle size (to minimize diffusion distances), uniform particle size (to avoid grain growth), freedom from agglomeration, equiaxed shapes (to improve packing), and absence of impurities or deviations from desired stoichiometry. Most conventional powders do not possess these characteristics.

Metal carbides have become the subject of increasing attention in recent years, as a result of the wide range of useful properties which they have been found to possess. The refractory metal carbides in particular have been of interest as a result of their high melting points and consequent ability to withstand the high temperatures which are encountered in many fields of modern technology. Many of these metal carbides display great hardness, and accordingly, fine powders of such metal carbides are often employed as abrasives, in which application they possess considerable wear resistance. Alternatively, such powders are often capable of being fabricated into a wide variety of useful shapes. Corrosion resistance is another important property of many of these metal carbides.

Metal borides and nitrides generally bear a marked similarity to metal carbides in many respects, and accordingly much interest has been generated in the metal borides and nitrides for much the same reasons as mentioned above in connection with the metal carbides. Refractory metal borides and nitrides are of great interest in connection with high temperature applications, and many metal borides and nitrides exhibit the highly desirable properties of hardness, refractoriness, wear resistance, and corrosion resistance.

DESCRIPTION OF THE PRIOR ART

A variety of processes have been employed for the preparation of various ceramic powders. The discussion which follows will place emphasis on conventional processes utilized to form metal carbides, borides and nitrides. However, the methods described below are for the most part generic. That is, a wide range of additional ceramic materials are conventionally prepared according to the following methods, with only minor procedural variations.

The most generally preferred commercial process for the production of metal carbides, and one which has been extensively employed for large scale production, involves the principle of a carbothermic reduction of metal oxides. According to such a process a reactive mixture is prepared comprising a carbon source such as finely divided carbon, and a metal oxide source such as a metal oxide and/or a metal compound which will form a metal oxide upon heating. The mixture is fired at a relatively high temperature, whereby the metal oxide which is present initially or which is formed thereupon is reduced, the corresponding metal carbide or carbides being concomitantly produced. The temperature of firing is generally in the range of 1100°–2300° C., the temperature being selected according to the particular metal carbide or carbides to be produced. The reaction is generally carried out in protective, non-interfering atmosphere, such as an inert gas or a vacuum. Many different metal carbides have been prepared according to this process, including the carbides of titanium, zirconium, hafnium, vanadium, niobium, tantalum, chromium, molybdenum, tungsten, and uranium, as well as a number of other transition metals. As a specific example, titanium carbide may be prepared by mixing titanium oxide with carbon black and reacting the mixture at 1,900° to 2,300° C. Sintered lumps of titanium carbide are produced which are subsequently broken up in jaw crushers and fine-milled into powder.

By analogy with the foregoing method of metal carbide production, a preferred process for the large scale production of various metal borides is based upon the carbothermic reduction of boric oxide and one or more oxides of boride-forming metals. According to this general process, a reactive mixture is prepared comprising a carbon source such as finely divided carbon, and a metal oxide source comprising (1) one or more oxides of boride-forming metals and/or metal compounds which will form such metal oxide upon heating, and (2) a boric oxide source such as boric oxide itself and/or a substance which will form boric oxide upon heating. The mixture is fired at a suitable temperature in a non-interfering atmosphere in any suitable furnace, whereby the metal and boron oxides which are present initially or which are formed thereupon interact with the carbon and the corresponding metal boride or borides are produced. Numerous metal borides have been produced according to such a process, including for example, titanium, zirconium, hafnium, vanadium, tantalum, and nickel borides.

Several processes are used to commerically produce metal nitrides. In one method, finely divided metal powder is nitrided at 1,000° to 1,400° C. for one to four hours. Grinding the product and repeating the process several times yields stoichiometric metal nitride powder. A second process, which is analogous to the methods of forming carbides and borides described above, is the carbothermic reduction of a metal oxide in the presence of nitrogen. For example, in the production of titanium nitride, titanium oxide is heated at 1,600° C. for 2.5 hours with nitrogen in a reducing atmosphere, giving 98 to 99 percent pure titanium nitride.

In recent years, numerous ceramic materials have been formed using a process termed "self-propagating high-temperature synthesis" (SHS), that involves an exothermic, self-sustaining reaction between elemental powders of ceramic forming constituents. The SHS process involves mixing and compacting powders of the constituent elements, and locally igniting a portion of a green compact with a suitable heat source. On ignition, sufficient heat is released to support a self-sustaining reaction, which permits the use of sudden, low power initiation of high temperatures, rather than bulk heating over long periods. Exemplary of these techniques are the patents of Merzhanov et al, U.S. Pat. Nos. 3,726,643; 4,161,512; and 4,431,448, among others, hereby incorporated by reference.

In most SHS processes, the product is a ceramic or intermetallic that may be relatively dense for use as a finished body, or may be crushed for use as a powder raw material. In a few instances, binders, such as metal, have been included with the compressed powders, but typically constitute 10 percent or less by weight of the mixture, and almost invariably less than 30 percent. The temperatures associated with the SHS process are extremely high, resulting in interparticle sintering and grain growth of the resultant ceramic particles. If it is desired to form powder from SHS produced ceramic material, grinding and/or milling steps are necessary to break up the bulk material.

In U.S. Pat. No. 3,726,643, there is taught a method for producing high-melting refractory inorganic compounds by mixing at least one metal selected from Groups IV, V, and VI of the Periodic System with a non-metal, such as carbon, boron, silicon, sulfur, or liquid nitrogen, and heating the surface of the mixture to produce a local temperature adequate to initiate a combustion process. In U.S. Pat. No. 4,161,512, a process is taught for preparing titanium carbide by ignition of a mixture consisting of 80-88 percent titanium and 20-12 percent carbon, resulting in an exothermic reaction of the mixture under conditions of layer-by-layer combustion. These references deal with the preparation of bulk ceramic materials, absent a binder.

U.S. Pat. No. 4,431,448 teaches preparation of a dense, hard alloy by intermixing powders of titanium, boron, carbon, and a Group I-B binder metal or alloy, such as an alloy of copper or silver, compression of the mixture, local ignition thereof to initiate the exothermic reaction of titanium with boron and carbon, and propagation of the ignition, resulting in an alloy comprising titanium diboride, titanium carbide, and up to about 30 percent binder metal. The binder metal acts as a ductile consolidation aid to fill in voids between the sintered ceramic particles, thus increasing product density. Products made by this method are suitable for use as finished bodies rather than for powder production.

Although the above-mentioned methods, such as carbothermic reduction and certain SHS processes, are highly advantageous with respect to their suitability for large scale production, certain serious drawbacks have long been recognized in such processes. These methods generally require high temperatures and numerous processing steps for powder production. In addition, long reaction times and precise controls are often necessary. The powders produced are often inconsistent in size and too impure to use in making reliable components. More particularly, it has been generally observed in conventional practice that the ceramic materials prepared according to such processes tend to be produced in the form of massive pieces, rather than as a fine powder. Since it is almost invariably desired to utilize the various ceramics in the form of fine powder, it is necessary to subject the massive pieces formed to grinding and milling operations in order to obtain such powders. Since the ceramic materials are generally extremely hard, such milling operations are necessarily quite difficult, time-consuming and costly. Moreover, the abrasive nature of many of these ceramics frequently tends to result in serious contamination in the powdered product due to abrasion of the milling apparatus during the operation. Several purification steps are therefore required to decrease the impurity content of the resultant powder. Another major shortcoming of the aforementioned processess is that the product formed is usually quite non-homogeneous, and samples of the product taken from various parts of the reacted mass may vary markedly in their composition. While this undesirable feature can be remedied to some extent by additional grinding operations, batch-to-batch variation in powder composition is more difficult to control. Thus, in general, the processes described above for the preparation of ceramic materials present formidable obstacles to obtaining powdered products of high purity and of stoichiometrically well-defined and controlled composition.

A conventional process for directly producing fine ceramic powders which may avoid the additional grinding and milling steps noted above is known as gas-phase synthesis. This method involves reacting at least two gaseous reactants to form the desired powder. The ceramic forming reaction is initiated by a variety of heating methods including: furnace, radio frequency induction and plasma means. Particle sizes of less than 0.1 micron are typically achieved by these processes. Various ceramic powders are produced by gas-phase synthesis. For example, titanium diboride has been produced according to the following reaction:

$$TiCl_4(g) + 2BCl_3(g) + 5H_2(g) \rightarrow TiB_2(s) + 10HCl(g)$$

wherein hydrogen is used to reduce the halides $TiCl_4$ and $BCl_3$ to form $TiB_2$. This process is highly endothermic and requires high temperatures to initiate the reaction. $TiB_2$ particle sizes of approximately 0.05 micron have been achieved by this method.

$Si_3N_4$ powders have been prepared in both a radio frequency plasma and an arc plasma according to the following reaction:

$$3SiCl_4(g) + 4NH_3(g) \rightarrow Si_3N_4(s) + 12HCl(g).$$

Similarly, gas-phase synthesis has been used to produce TiN powders. In this process titanium tetrachloride ($TiCl_4$) is reacted with nitrogen or ammonia at temperatures above 1,300° C. Such high temperatures are needed to nucleate the powder in free space. Zirconium and vanadium nitrides have also been synthesized from the appropriate chlorides and $NH_3$, with $H_2$ and $N_2$ present in some cases.

The preparation of various metal carbides such as TiC and SiC has also been achieved by reacting the appropriate metal chloride and methane in a plasma.

The gas-phase synthesis techniques described above require precise processing controls to obtain ceramic powders of satisfactory quality. Large variations in powder characteristics such as particle size, stoichiometry and crystallinity occur due to minor variations in processing parameters such as temperature and gas concentration. The nature of the gas-phase reaction is such that, within the reaction zone, large temperature and gas concentration gradients are present. The less than ideal thermal profiles and gas concentrations allow for a distribution in nucleation rates and growth times which results in large variations in particle size. In general, gas-phase synthesis processes are energy inefficient and produce low yields. The high temperatures typically involved in the ceramic forming reactions require large energy inputs. Yields of less than 20 percent are common for conversions of starting gasses to final ceramic powder with. Another disadvantage of gas-phase synthesis processes is that the ceramic particles produced often bond together due to the high temperatures involved, yielding agglomerates or chains of ceramic particles. Also, in gas-phase synthesis, the product powder is usually entrained in large volumes of gas, requiring large collection systems such as filters or electrostatic precipitators.

U.S. Pat. Nos. 3,726,956 to Silver and 4,470,956 to Cheney et al, hereby incorporated by reference, relate to methods of dissolving metals away from ceramic particles. In U.S. Pat. No. 3,726,956 a method is taught for dissolving tungsten or molybdenum materials such as molybdenum coatings from fissionable materials such as nuclear fuel ceramic particles by contacting the molybdenum with a sodium hypochlorite solution until the dissolution is complete. The ceramic particles are thorium oxide, uranium oxide, plutonium oxide or a mixture thereof. In U.S. Pat. No. 4,470,956 a method is taught for dissolving cobalt, nickel and iron binder metals from metal carbide particles by treating the metals with hydrochloric acid until dissolution is complete. The process is used to recover metal carbide particles from cemented carbide scrap material. The particles to be recovered may comprise one or more transitional carbides of a metal of Groups IVB, VB and VIB of the Periodic Table, such as tungsten carbide and titanium carbide. Each of these references deals with the recovery of ceramic particles by dissolution of a metal which surrounds the particles. However, no teaching is given as to the method of forming the ceramic particles. Moreover, there is no teaching of the formation of ceramic particles by an in-situ precipitation reaction of ceramic-forming reactants in the presence of a solvent metal. It is believed that the subject ceramic particles of each of these references are produced by the conventional techniques discussed above, or slight variations thereof.

By contrast, the methods contemplated by the present invention provide a means of producing fine, unagglomerated, unsintered, highly pure ceramic powders of relatively uniform size, having controlled morphology, stoichiometry and crystallinity. The present invention permits simplification of procedures and equipment compared to the prior art. For example, the present process obviates the need for grinding and milling equipment, and avoids impurities introduced by the use of such equipment, because ceramic particles are directly produced in the size range of from about 0.01 to 10 microns. Indeed, the present invention may provide particles in a unique intermediate size range between the ultrafine particles produced by gas phase synthesis and the large particles generated in processes such as carbothermic reduction. The present invention also overcomes the need for complex collection systems such as filters and electrostatic precipitators for separating ceramic particles from large volumes of gas. The process of the present invention also avoids prolonged high temperatures at which ceramic particles sinter or bond together. Furthermore, the method of the present invention is more energy efficient than many prior art techniques in that relatively low energy input is required and high ceramic yields are obtained by the powder forming process. Moreover, the methods of the present invention are generally applicable to the formation of all ceramics such as metal carbides, borides, nitrides, oxides, silicides, oxynitrides, sulfides and oxysulfides which can be produced by an in-situ precipitation reaction. With these facts in mind, a detailed description of the invention follows which achieves advantages over known processes of powder production.

SUMMARY OF THE INVENTION

It is an object of the present invention to provide a method for forming fine particles of second phase materials, such as ceramics or intermetallics. Second phase materials produced by the present invention include, inter alia, metal borides, carbides, oxides, nitrides, silicides, beryllides, oxynitrides, sulfides, and oxysulfides.

It is a particular object of the present invention to provide said particles in substantially single crystal form. The method comprises contacting second phase-forming reactants in the presence of a solvent metal in which the second phase-forming reactants are more soluble than the second phase material, at a temperature at which sufficient diffusion of the reactants into the solvent metal occurs to cause an exothermic second phase-forming reaction of the reactants to thereby precipitate particles of second phase material in a solvent metal matrix. Thereafter, the metal matrix is separated from the second phase particles to yield a powder of the second phase material.

Separation of the metal matrix may be achieved by dissolving the metal, boiling off the metal, concentration of the particles by flotation, sedimentation and other gravity effects, or a combination thereof. In the dissolution method, a composite comprising the second phase particles in a metal matrix is treated with a dissolution medium to dissolve the metal matrix away from the second phase particles. The particles are then separated from the dissolution medium and dried to produce a powder of the second phase material. In the boiling method, the solvent metal in which the second phase particles are formed is caused to volatilize, either during the exothermic second phase-forming reaction, in which case heat given off from the reaction is used to boil the solvent metal, or subsequent to formation of the metal-second phase composite, in which case the composite is reheated to a temperature above the boiling point of the metal matrix. A substantial proportion of the solvent metal is thereby boiled off from the second phase particles. In one embodiment of the flotation method, second phase particles are produced which are not wet by the solvent metal or an alloy of the solvent metal and are rejected to the outer surface of the liquid metal. Alternatively, in certain systems where there are significant density differences between the metal and the second phase, the particles may either float to the top or settle to the bottom of the molten metal and may be removed by skimming, decanting, centrifuging and the like.

It is also an object of the present invention to provide a method for the formation of fine powders of second phase materials, such as ceramics or intermetallics, wherein the powders are comprised of particles that are substantially unagglomerated, unsintered and have controlled morphology, crystallinity, purity, stoichiometry and narrow particle size distribution.

DESCRIPTION OF THE PREFERRED EMBODIMENTS

The present invention constitutes a process whereby second phase-forming reactants react in the presence of a solvent metal to form a finely-divided dispersion of the second phase material in a solvent metal matrix. Thereafter, the second phase particles and metal matrix may be separated by dissolving or boiling off the metal, or in the case where there are significant density differences between the particles and the molten metal, by gravity separation techniques including skimming, decanting and centrifuging. Alternatively, in the case where the particles are not wet by the molten metal, the particles are rejected to the outer surface of the melt and may be separated by any suitable technique, such as skimming. After separation, the very fine second phase particles may be recovered to yield a powder.

The discussion herein focuses upon the production of ceramic second phase particles, particularly single crystal ceramic particles. However, the production of additional second phase materials such as intermetallics is considered to be within the scope of the present invention.

The size of the second phase particles produced by the methods of the present invention may range from about 0.01 to about 10 microns and more preferably from about 0.1 to about 5 microns. In certain embodiments of the present invention elongated particles, such as whiskers or needles, may be produced. The widths of such elongated particles may range from about 0.1 to about 5 microns, while the lengths may range up to about 100 microns.

Exemplary of suitable second phase particles are metal borides, carbides, oxides, nitrides, silicides, sulfides, beryllides, oxynitrides and oxysulfides. Preferred metal constituents of the second phase particles are metals of Groups IVB, VB and VIB of the Periodic Table. Preferred second phase particles include refractory metal borides, carbides, nitrides, silicides and beryllides, such as $TiB_2$, $ZrB_2$, $VB_2$, $WB_2$, $HfB_2$, $TaB_2$, $MoB_2$, $TiC$, $WC$, $VC$, $HfC$, $TaC$, $TiN$, $ZrSi_2$, $MoSi_2$, $Ti5Si_3$ and $TiBe_{12}$. Complex compounds may also be formed by the methods of the present invention. Exemplary of such complex compounds are: $TiZrB$, $TiNbC$, $TiVC$, $TiZrC$, $TiHfC$, and $TiTaC$. It is noted that the nomenclature used above is intended to list the elements present in the complex compounds but is not intended to list atomic proportions. For example, $TiVC$ designates a compound containing the elements titanium, vanadium, and carbon, but is not intended to imply the elements are present in equal proportions. The methods of the present invention also provide for the formation of second phase particles of plural compositions. Thus, multiple dispersoids, including those listed above, may be produced by a single second phase-forming reaction.

Suitable second phase-forming reactants include all of the elements which are reactive to form second phase precipitates, including, but not limited to, transition elements of the third to sixth groups of the Periodic Table. The second phase-forming reactants may therefore be defined as the constituents of the second phase material produced. Particularly useful second phase-forming reactants include aluminum, titanium, silicon, boron, carbon, oxygen, nitrogen, sulfur, molybdenum, tungsten, niobium, vanadium, zirconium, chromium, hafnium, cobalt, nickel, iron, magnesium, zinc, tantalum, manganese, lithium, beryllium, thorium, cesium and the rare earth elements including scandium, yttrium, lanthanum, and the lanthanide series elements such as cerium and erbium. These second phase-forming reactants may be provided as starting materials either in the form of elemental powders, in the form of an alloy comprising the second phase-forming reactant and a solvent metal, in compound form, or a combination thereof. Compounds which may be used as sources of second phase-forming reactants include: boron nitride ($BN$), boron carbide ($B_4C$), boron oxide ($B_2O_3$), aluminum boride ($AlB_{12}$), aluminum carbide ($Al_4C_3$), aluminum nitride ($AlN$), silicon carbide ($SiC$), copper oxide ($CuO$) and iron oxide ($Fe_2O_3$). It should be particularly noted that apparently gaseous second phase-forming reactants such as oxygen and nitrogen may thus be utilized without the use of gasseous starting materials.

As the solvent metal, a material capable of dissolving or at least sparingly dissolving the second phase-forming reactants, and having a lesser capability for dissolving or otherwise reacting with the formed second phase precipitate, is used. Thus, at the temperatures experienced during the particle formation process, the solvent metal must act as a solvent for the second phase-forming reactants, but not for the desired second phase precipitate. It is especially to be noted that the second phase-forming reactants have a greater affinity for each other than either has for the solvent metal. In addition, when plural metals are used, the metals may individually, or collectively, act as solvent materials for the second phase-forming reactants. Thus, the second phase-forming reactants, but not the second phase itself, must be soluble in at least one of the metals. An additional constraint is that the solvent metal must either be soluble in a dissolution medium that is substantially inert with respect to the second phase particles, must be capable of being boiled off from the second phase particles, must be of significantly different density than the particles, or must not wet the second phase particles.

The solvent metal materials may be aluminum, nickel, copper, titanium, cobalt, iron, platinum, gold, silver, niobium, tantalum, boron, zinc, molybdenum, yttrium, hafnium, tin, tungsten, lithium, beryllium, magnesium, bismuth, antimony, thorium, silicon, chromium, vanadium, zirconium, manganese, scandium, lanthanum and rare earth elements, and alloys or intermetallics thereof. Preferred solvent metals include aluminum, nickel, copper, titanium, magnesium, zinc, cobalt and iron. Since the process of the present invention involves the separation of the solvent metal away from the second phase precipitates, it is generally desireable to use the least expensive metals that are conducive to the formation of the desired second phase particles and that are capable of being removed from the particles thereafter. Only in the preparation of extremely high-value-added powders would it be practical to consider solvent metals such as platinum, gold, silver, yttrium, hafnium, beryllium, thorium, scandium and lanthanum if there are unique particle properties obtainable therewith. These particular metals are more likely to find application as minor alloying additions to effect modifications in second phase particle composition, morphology, size, etc. Plural solvent metal materials may, of course, be present to form the solvent metal matrix. It is noted that the term solvent metal matrix, as used herein, is meant to define a matrix which consists predominantly of a metal or metal alloy. However, other materials, for example, intermetallics may also be present.

The solvent metal may comprise from about 10 to 95 volume percent of the composite, with the remainder comprising the desired second phase particles. More preferrably, the solvent metal may comprise from about 30 to 70 volume percent of the composite. The lower limit of the percent of solvent metal used is constrained by the incidence of undesireable sintering between the second phase particles. When the volume percentage of solvent metal is below approximately 30 percent, the second phase particles will generally be in contact with each other due to geometric considerations. For example, there is less than 30 volume percent free space in a close-packed array of sphericle dispersoids. Accordingly, the incidence of interparticle sintering may increase substantially as the volume fraction of the solvent metal decreases below about 30 volume percent in some systems. The upper limit of the percent of solvent metal used is controlled by the point at which separation becomes impractical. In order to increase the yield of second phase particles, it is generally preferrable to use the least amount of solvent metal necessary to form particles having the desired characteristics.

In accordance with the present invention, the technique for forming composites which are suitable sources of second phase particles can take place by various different modes, all utilizing in-situ precipitated dispersoids. One technique may be chosen over the others because of practical or cost constraints, but it is important to note that quite unique distinct particle types and particle characteristics may be obtained by each of these methods.

The fundamental in situ precipitation process is directed to the in-situ precipitation of fine particulate ceramics, such as refractory hard metal borides, carbides and nitrides within metal and alloy systems to produce metal matrix composites. More particularly, it is a method whereby ceramic forming reactants react in a solvent metal to form a finely-divided dispersion of the ceramic material in a solvent metal matrix. In this embodiment, an exothermic second phase-forming reaction is initiated by bulk heating of the second phase-forming reactants and the solvent metal. This fundamental or bulk heating technique is described in greater detail in U.S. patent application Ser. No. 943,899, filed Dec. 19, 1986, hereby incorporated by reference, of which this application is a Continuation-In-Part.

In accordance with the fundamental in situ precipitation process, the second phase-forming reaction may be initiated in different physical states. Thus, a second phase-forming reaction between elemental powders of second phase-forming reactants within the solvent metal can be initiated in a plasma arc or flame, or via diffusion of the second phase-forming reactants through the liquid solvent metal, or, in cases where solid phase diffusion is rapid, in a solid state. In the case where two alloys are used, each containing a second phase-forming reactant alloyed with a solvent metal, the reaction can also occur in the solid state, liquid state, or in a plasma arc or flame.

In an alternative mode, porous composites comprising second phase dispersoids in a solvent metal matrix are formed using a local ignition process. It involves mixing and compressing powders of second phase-forming reactants and a solvent metal to form a green compact, followed by local ignition to initiate a substantially isothermal wave front which moves along the compact. The propagating reaction results in the in-situ precipitation of substantially insoluble second phase particles in a solvent metal matrix. The substantially isothermal wave front, which promotes uniformity of second phase particle size, results from the high thermal conductivity of the solvent metal, in combination with concentrations of the solvent metal sufficient to achieve a substantially isothermal character across the material to be reacted. The porosity of the resultant composite preferably exceeds about 10 percent, and more preferably exceeds about 25 percent. The production of second phase/solvent metal matrix composites using a local ignition process is discussed in greater detail in U.S. patent application Ser. No. 927,014, filed Nov. 5, 1986, hereby incorporated by reference.

Another mode for the production of composites which are suitable sources of second phase particles relates to a sponge addition process for forming second phase composite materials having a dispersion of second phase particles throughout a "final metal matrix". The process comprises precipitating at least one second phase material in a solvent metal matrix by contacting second phase-forming reactants in the presence of a solvent metal, at a temperature at which sufficient diffusion of the reactants into the solvent metal occurs to initiate the reaction of the constituents to produce a first composite comprising a relatively high concentration of finely divided particles of second phase material in a solvent metal matrix. The first composite, or "sponge", is then introduced into a molten host metal, metal alloy or intermetallic to obtain a second composite comprising the second phase within a final metal matrix. In accordance with the present invention, this process may be used to advantage if it is found that second phase particles having the desired characteristics, such as particle size or morphology, are formed using a solvent metal that is not satisfactory for further separation. For example, if the solvent metal is found to be insoluble in a particularly desireable dissolution medium, the metal may be alloyed with another host metal by the sponge addition method to form a final metal matrix that is soluble in the dissolution medium. The sponge addition method may also be used to form a molten alloy of the solvent metal that wets the second phase particles to a lesser degree in order to aid in the rejection of the particles from the melt. Alternatively, the sponge addition method may be used to form a molten alloy having significantly different density than the solvent metal in order to aid in gravity separation of the particles. Also, the sponge addition method may be used to introduce alloying additions which may advantageously change the morphology, composition and/or other characteristics of the second phase particles during processing. The sponge addition process is explained in greater detail in U.S. patent application Ser. No. 927,032, filed Nov. 5, 1986, hereby incorporated by reference.

Another alternative mode relates to a direct addition method for the preparation of metal-second phase composites by direct addition of a mixture of second phase-forming reactants and a solvent metal to a molten matrix metal, resulting in the in-situ formation of finely dispersed second phase particles within a final metal matrix. The second phase-forming reactants may be added as a preform or compact of individual powders of reactive elements or reactive compounds and the solvent metal. It is to be noted that a solvent metal must be present in the preform or compact to facilitate the reaction of the second phase-forming reactants. This process, which may be referred to as the direct addition process, is discussed in greater detail in U.S. patent application Ser. No. 927,031 filed Nov. 5, 1986, hereby incorporated by reference.

An additional mode relates to the preparation of composites having intermetallic matrices. In this embodiment, the composites produced comprise second phase particles dispersed in intermetallic (preferably aluminide) matricies. Methods of preparation include the following: (A) coformation of the intermetallic and second phase by inclusion of appropriate amounts of starting ingredients, in elemental form, so as to ultimately provide essentially stoichiometric proportions of the constituents of the intermetallic and second phase, in a reaction vessel; (B) use of previously formed intermetallic material as a solid, followed by an in-situ precipitation of the second phase material therein in a separate stage; (C) preparation of a master concentrate of the second phase dispersoid in one or more metals or alloys that do not form intermetallics with themselves, which metals are convertible to form the desired intermetallic, followed by dilution of said concentrate in an intermetallic, or in further metals or alloys with which the matrix material of the concentrate is reactive to form intermetallics; (D) direct addition of one or more second phase forming reactants in the presence of an intermetallic to a melt comprising an intermetallic derived solvent and the complementary second phase reactants to generate an in-situ second phase forming reaction in the intermetallic derived solvent; and, (E) direct addition of one or more second phase forming reactants and an intermetallic precursor to a melt containing one or more metals or alloys with which said intermetallic precursor is reactive to form intermetallics, and with which said second phase forming reactant is reactive to form the second phase dispersoid. In accordance with the present invention, the production of second phase/intermetallic composites by these methods may be used to advantage if it is found that second phase particles having desired characteristics, such as unique composition and/or morphology, are formed within the intermetallic matrices. Of particular interest is method (C) above which involves preparing a powder mixture of second phase-forming reactants and a solvent metal, which solvent metal acts as a "first intermetallic precursor". The mixture is heated to initiate an exothermic reaction to thereby form a first composite comprising a distribution of second phase particles in a first intermetallic precursor matrix. This composite is then introduced into a second metal or "second intermetallic precursor" which combines with the first intermetallic precursor to form an intermetallic material. A second composite is thus produced comprising second phase particles in an intermetallic matrix. It is noted that during this process the second phase particles may remain substantially unchanged. However, in certain systems, it may be possible to alter characteristics such as morphology, size and composition of the second phase particles. This process is explained in greater detail in U.S. patent application Ser. No. 873,890, filed, Jun. 13, 1986, hereby incorporated by reference.

It is noted that rapid solidification (RS) techniques may be used in conjunction with the methods above to produce unique particle phases. For example, in the production of metal/second phase composites by any of the methods above, the reaction mass may be cooled immediately following the second phase-forming reaction by conventional RS techniques to form a powder. Alternatively, composites which have been formed by any of the preceding methods may be remelted and subsequently processed using RS techniques to form powders. The powders produced by each of these RS techniques are made up of particles, each of which comprises second phase particles in a metal matrix. These powders may contain unique second phase particles that are distinct from the second phase particles produced by the initial second phase forming reaction and which may not be attained by rapid solidification of conventional materials.

It has been found that in practicing the methods discussed above, it is possible to control certain characteristics of the second phase particles produced, such as size, variation in size, and morphology. Control of particle size, for example, may be achieved during the exothermic second phase-forming reaction by varying heat-up rate, maximum temperature attained and cool-down rate. Additional factors which may influence particle size include the characteristics of the starting materials used and the ratio of solvent metal to second phase-forming reactants in the starting mixture. Examples of particle size control by the process of the present invention are given in examples 2 and 6.

As is known in the art, elevated temperature spikes produced by, for example, exothermic reactions, remain higher and subside more slowly for an article of large geometric size than for an article of smaller size. Conditions of high temperature for long periods of time favor particle growth of ceramics. Thus, the formation of relatively small dimension composites by the various modes discussed above may facilitate quicker cooling and limit particle growth and/or sintering of the second phase.

Certain characteristics of the starting second phase-forming reactants, such as crystal structure, may influence the second phase particle size in some systems. For example, in the formation of titanium diboride particles within an aluminum solvent metal matrix, the use of amorphous boron may result in the precipitation of finer particle size titanium diboride than does the use of crystalline boron in an otherwise comparable mixture.

The ratio of solvent metal to second phase-forming reactants has been found to have an effect on second phase particle size. Generally, as the volume percent of solvent metal is increased from a lower limit of about 10 percent to an upper limit of about 95 percent, the resultant second phase particle size tends to decrease to a minimum value at an intermediate second phase loading and tends to increase as the percentage of solvent metal is increased beyond the intermediate level. It is therefore possible to control the size of the second phase particles produced, to some extent, by varying the relative amount of solvent metal. Typical percentages of solvent metal which yield second phase particles of the smallest size are generally in the range of 40 to 60 volume percent. However, the percentages may vary widely depending upon the particular solvent metal/second phase system utilized.

A wide variety of particle morphologies may be achieved by the methods of the present invention. For example, equiaxed shapes including spherical and faceted particles may be produced. Elongated particles such as whiskers and needles may be formed. Various other shapes such as discs are also possible. Particle shape appears to be dependent to a large extent on the composition of the second phase produced. For instance, complex compounds such as TiZrC and TiVC tend to form elongated particles having widths of between 1-5 microns and lengths of between 5-100 microns. However, it has been found that particles of essentially the same composition may be formed in different shapes. For example, TiC particles formed in a relatively pure aluminum matrix are typically spherical, while TiC particles formed in an aluminum matrix containing a minor portion of particulate $Al_2O_3$ may be disc shaped. As evidenced by this example, the presence of additional material during the second phase-forming reaction, other than the second phase-forming reactants and the solvent metal, may alter the shape of the particles produced. Other factors, such as alloying additions to the matrix metal in which the particles are dispersed, may also change the morpohology of the second phase particles.

According to the process of the present invention, a composite material comprising second phase dispersoids within a metal matrix produced by any of the methods described above is treated to separate the metal matrix from the second phase particles. Separation may be achieved by dissolution of the metal matrix, volatilization of the metal matrix, or melting of the metal matrix to utilize differential density or non-wetting effects.

The dissolution technique involves treating the produced metal/second phase composite by placing the composite in contact with a dissolution medium in any suitable manner, such as submersion, spraying, swabbing, etc., until the required dissolution of the metal matrix is complete. The dissolution process may be completed in one treatment step, or in multiple steps.

Once the metal matrix has been dissolved, the remaining second phase particles may be separated by any suitable process such as filtering, centrifuging, decanting and the like. The particles may then be dried by conventional techniques to yield fine unsintered powders in the size range of 0.01-10 microns. In order to minimize surface contamination of the powders, such as the formation of oxide coatings, it may be desirable to perform the drying step in a controlled environment, for example, in a vacuum or under an atmosphere of inert gas.

As the dissolution medium, a medium which is capable of dissolving the metal matrix of the composite, but substantially inert with respect to the second phase particles, may be used. Thus, the dissolution medium must not be chemically reactive with the second phase particles to any substantial degree and must not otherwise adversely affect the second phase particles. Suitable dissolution media include acid solutions and alkaline solutions. Of course, the use of a particular dissolution medium will depend upon the particular matrix metal to be dissolved and the particular second phase particles to be recovered. As a specific example, a composite comprising a dispersion of titanium diboride particles within an aluminum metal matrix, produced by either of the bulk heating, local ignition or direct addition methods discussed above, may be placed in a dissolution medium comprising an aqueous solution of hydrochloric acid to dissolve the aluminum matrix, yielding a suspension of titanium diboride particles. The particles may then be filtered and dried to yield titanium diboride powder of very fine particle size (i.e. 0.1-2.0 microns).

Specific dissolution mediums include aqueous solutions of at least one of the following acids: HCl, HF, $H_2SO_4$, $HNO_3$, $H_2CrO_4$ and $H_3PO_4$. Additional dissolution media include aqueous solutions of at least one of the following alkalis: NaOH and $NH_4OH$. Again, it is noted that the specific dissolution medium used will vary depending upon the composition of the second phase particles and matrix metal of the composite to be treated. The dissolution medium must remain substantially inert with respect to the particular second phase particles to be recovered, while being able to dissolve the metal matrix to the required degree. Information concerning the degree of solubility of matrix materials within various dissolution media is readily available to one skilled in the art.

The dissolution method takes advantage of the fact that ceramic materials in general, and particularly those such as borides, carbides and nitrides, are relatively chemically inert. Therefore, a wide range of dissolution media are satisfactory for use in the present process, with the determining factor generally being the ability of the dissolution medium to dissolve the metal matrix. Exemplary of chemically inert ceramics are titanium diboride and titanium carbide. $TiB_2$ is not attacked by cold concentrated hydrochloric or sulfuric acids, but dissolves slowly at boiling temperatures. It dissolves readily in mixtures of nitric acid and hydrogen peroxide or sulfuric acid. TiC is not attacked by acids, hot or cold, except nitric acid, aqua regia, mixtures of nitric and hydrofluoric acids, and mixtures of nitric and sulfuric acids.

The rate of dissolution of the metal matrix will vary depending upon the composition of the matrix and the particular dissolution medium chosen. It is generally preferred to maximize the dissolution rate in order to minimize processing time. For a composite having a given composition, factors which may increase the dissolution rate within the medium include heating, stirring, adjusting the solution concentration, using a catalyst and the like. Also, a relatively high composite surface area may increase the dissolution rate. Therefore, use of composites having small geometrical size and/or relatively high porosity may be beneficial. Composites produced by the bulk heating and local ignition methods of the present invention have been found to have relatively high porosity, making them highly suitable for further dissolution. If it is desired to decrease geometrical size, composites produced by any of the methods of the present invention may be crushed, ground, milled, etc., prior to dissolution.

It is noted that after dissolution of the matrix metal and separation of the ceramic particles, the remaining dissolution medium may have further use. An example would be in the dissolution of an aluminum metal matrix with a hydrochloric acid solution wherein aluminum chloride ($AlCl_3$) is formed in solution. It may be possible to recover and calcine the $AlCl_3$ to form aluminum oxide ($Al_2O_3$). A variety of such uses may be possible depending upon the specific metal matrix and dissolution media employed.

An alternative method for the separation of the matrix metal from the second phase particles involves the volatilization of the solvent metal, wherein the solvent metal is boiled off from the second phase particles. In the boiling method, the solvent metal in which the second phase particles are formed is caused to volatilize, either during the exothermic second phase-forming reaction, in which case heat given off from the reaction is used to boil the solvent metal, or subsequent to formation of the metal-second phase composite, in which case the composite is reheated to a temperature above the boiling point of the metal matrix. A substantial proportion of the solvent metal is thereby boiled off from the second phase particles. Various techniques may be used to assist in boiling off the metal. For example, a low boiling point solvent metal, such as zinc, may be used. The use of a vacuum during the volatilization process will advantageously lower the temperature at which the solvent metal boils and may aid in the removal of gaseous solvent metal away from the second phase particles. In the use of green compacts comprising powders of the second phase-forming reactants and the solvent metal, it may be advantageous to provide a high ratio of second phase to solvent metal in order to increase the temperature achieved during the exothermic reaction. Also, the use of green compacts of relatively small volume may aid in boiling off the solvent metal by providing a smaller distance that the gaseous solvent metal must travel to escape the mass of material. Plasma spray techniques, which inherently involve the use of high temperatures, may also aid in the volatilization of the solvent metal. For example, in the fundamental in-situ precipitation process disclosed above, a plasma may be used to both initiate the second phase-forming reaction and to boil off the solvent metal. Alternatively, preformed composites produced by the methods of the present invention may be introduced into a plasma flame to boil off the metal matrix. The various techniques discussed above may be used separately or in combination to aid in the volatilization of the solvent metal.

A third method for the separation of second phase particles from a metal matrix involves melting the metal and removing particles which are either non-wet by the liquid metal or which float to the surface or settle to the bottom of the melt due to a significant difference in density between the particles and liquid metal. In the non-wetting, or melt rejection process, the second phase particles are not wet by the molten solvent metal, or an alloy thereof, and are rejected to the outer surface of the molten metal. Thereafter, the particles may be removed by methods such as skimming or the like. It is noted that this process is limited to systems where second phase particles are not wet to any substantial degree by the solvent metal in which they are formed, or an alloy of the solvent metal in which they are formed. Alternatively, in certain instances where there is a significant difference in density between the second phase particles and the molten matrix metal, the particles may either float to the surface or settle to the bottom of the melt due to gravity effects. In this case, involving either flotation or sedimentation of the second phase particles, the particles may be removed from the melt by skimming, decanting, centrifuging and the like. In both of the preceding methods, separation of the particles may take place during the second phase-forming reaction. However, in the bulk heating and local ignition methods of the present invention, the solvent metal matrix of the composite produced is typically in the molten state for only a short time after the second phase-forming reaction. Therefore, it is usually necessary to remelt the metal matrix of the composite in order to complete the separation process.

It is to be noted that the methods for separating second phase particles from matrix metals disclosed above may be used in combination with each other. For example, particles which have been recovered by either volatilization of the matrix metal or flotation of the particles in a non-wettig metal may then be treated with a dissolution medium if it is found that the particles are coated with an undesirably high amount of matrix metal. It is also noted that in some instances it may be desirable to incompletely remove the matrix metal, thereby leaving a residual amount of matrix metal on the second phase particles. For example, in the fabrication of certain components from ceramic powders, a residual amount of metal present in the powders may advantageously act as a sintering/densification aid.

The second phase powders produced in accordance with the present invention have characteristics which make them highly suitable for use in a wide range of applications. For example, the characteristics of extremely fine particle size, narrow size distribution, lack of sintering, equiaxed shape, high purity, controlled stoichiometry and single crystallinity achieved by the present invention coincide with ceramic powder characteristics conventionally recognized as being ideal for the formation of high-quality ceramic components. Certain powders produced by the present invention are extremely useful as abrasives. For example, $TiB_2$ particles produced in accordance with the present invention are typically single crystals having faceted, equiaxed shapes, thus making them an ideal replacement for diamond grinding and polishing powders. High purity and well defined stoichiometry are achieved in powders produced by the present invention because impurities that may be present in the starting materials are typically dispersed into the solvent metal matrix the second phase-forming reaction and are later removed upon separation of the matrix from the second phase particles. The high purity and controlled stoichiometry of powders produced by the present invention make them highly suitable for electronics applications. The formation of uniformly mixed ceramic particles of multiple compositions from a single second phase-forming reaction provides a source of pre-mixed ceramic powders for the fabrication of ceramic/ceramic composites. Examples include the preparation of mixed borides and nitrides of titanium by reacting titanium and boron nitride in the presence of an aluminum solvent metal, which is subsequently removed from the resultant titanium diboride and titanium nitride particles. Similarly, mixed borides and carbides may be produced using boron carbide as a starting material. Equally, mixed borides and oxides may be produced using boron oxide as a starting material. In addition to the production of second phase powders having improved properties, the methods of the present invention provide a process for the formation of a wide range of ceramic powders such as metal carbides, borides, nitrides, oxides, silicides, beryllides, oxynitrides, sulfides and oxysulfides, some of which are difficult, if not impossible, to produce by conventional techniques.

The following examples illustrate various characteristics and aspects of the invention as discussed herein above. More particularly, examples 1–19 illustrate the production of composite materials comprising dispersions of fine second phase particles in metal matrices by the methods of the present invention. Each of these composites may be further treated to separate the second phase particles from the metal matrix to yield the second phase particles, in the manners discussed hereinabove, and as exemplified by Examples 20–22.

EXAMPLE 1

A mixture of powders comprising 34 percent by weight titanium, 16 percent by weight crystalline boron and 50 percent by weight aluminum, is isostatically compacted to 38,000 pounds per square inch. The compacted artifact is then heated in a furnace set at a temperature of 800° C. Upon reaching approximately 670° C., a rapid increase in temperature to approximately 1250° C. is noted. The rate of increase in temperature is very rapid (greater than 900° C. per minute) followed by a fast cool down rate of approximately 400° C. per minute. On subsequent examination, the sample is found to contain a fine dispersion (0.1–3 microns) of titanium diboride second phase particles in an aluminum matrix. The particles are single crystals of faceted, equiaxed shape and are substantially unsintered.

EXAMPLE 2

This example teaches the influence of amorphous boron on the particle size of titanium diboride precipitated in an aluminum matrix. An identical mixture (but for the use of amorphous boron instead of crystalline boron) as that described in Example 1 is prepared (that is, approximately 34 percent by weight of titanium, 16 percent by weight of boron, and 50 percent by weight of aluminum), compacted, and heated in a furnace. At a temperature of about 620° C., a rapid exotherm is noted. Subsequent examination reveals a distribution of very fine (0.1–1 micron), single crystal titanium diboride particles in an aluminum matrix. The particles are of faceted, equiaxed shape and are substantially unsintered.

EXAMPLE 3

Titanium, boron, and aluminum powders are ball-milled in the proper stoichiometric proportions to provide 60 weight percent titanium diboride second phase in an aluminum ceramic precursor matrix. The mixture is then packed in gooch tubing and isostatically pressed to 40 ksi, forming a compact approximately 1 centimeter in diameter by 5 centimeters long and having a density of 2.39 grams per cubic centimeter. The compact is then placed end to end with a graphite rod in a quartz tube under flowing argon. The graphite rod is heated in a radio frequency field which initiates a reaction at the interface of the compact and the rod. The reaction propagates the length of the compact at a rate of 0.77 centimeters per second. Analysis of the resultant composite reveals a dispersion of substantially unsintered, single crystal, faceted, equiaxed titanium diboride particles having an average diameter of approximately 1 micron in an aluminum matrix.

EXAMPLE 4

A mixture of 20.6 percent by weight of titanium, 9.4 percent by weight boron and 70 percent by weight of chromium is compacted to 40,000 pounds per square inch, and then heated in a furnace. A rapid exothermic reaction is noted at approximately 880° C. The resultant composite comprises titanium diboride second phase particles in a chromium matrix.

EXAMPLE 5

239.5 grams of titanium powder, 60.3 grams of carbon black, and 200.2 grams of aluminum powder are ball-milled for 30 minutes, packed in gooch tubing, and isostatically pressed to 40 ksi, forming a green compact 1 inch in diameter by 12 inches long. The compact is placed on two water cooled copper rails in a 4 inch diameter quartz tube under flowing argon. A 1 inch by 1 inch piece of carbon placed next to one end of the compact is induction heated until an exothermic reaction is initiated at the end of the compact. Power to the induction unit heating the carbon is turned off and the reaction is allowed to propagate the length of the compact. The resultant composite comprises 60 weight percent titanium carbide second phase particles having an average size of 1 micron in an aluminum matrix. The particles are of generally spherical shape, are substantially unsintered and appear to be single crystals.

EXAMPLE 6

This example teaches the influence of various carbon sources on the size of titanium carbide precipitated in an aluminum matrix. Five composites are produced in a manner similar to Example 5 above, each comprising 60 volume percent TiC in an Al matrix. The titanium and aluminum powders used to produce each composite are identical, with the powders being purchased from Consolidated Astronautics Inc. and having a size of minus 325 mesh. The following are the various sources of carbon used: Sample 1, Consolidated Astronautics 2 micron graphite; Sample 2, Consolidated Astronautics 1–5 micron graphite; Sample 3, Consolidated Astronautics super conductive 2 micron graphite; Sample 4, Consolidated Astronautics oxidation resistant graphite; and Sample 5, Monarch carbon black. Each of the composites produced contains substantially unsintered, single crystal TiC particles having generally spherical shape. However, particle size varies for each composite. The following is a list of particle size range and average particle size (in microns), obtained by SEM and quantitative image analyses of each composite:

Sample 1: 1.6–1.9, average 1.8;

Sample 2: 2.0-5.0, average 2.9;
Sample 3: 2.0-7.0, average 2.3;
Sample 4: 2.0-5.0, average 2.3;
Sample 5: 0.6-1.5, average 0.7.

EXAMPLE 7

Two composites are produced in a manner similar to Example 5 above, each comprising 40 volume percent TiC in an Al matrix. The sources of aluminum powder (Consolidated Astronautics, minus 325 mesh) and carbon powder (Monarch carbon black) are the same for each composite. However, the titanium used for the first composite is Consolidated Astronautics minus 325 mesh powder, while the titanium used for the second composite is Consolidated Astronautics 10 micron powder. Both composites produced contain substantially unsintered, single crystal TiC particles of generally spherical shape. From SEM and quantitative image analyses it is found that the particle size range of the first composite is 0.1-0.8 micron, with an average particle size of 0.4 micron, while the particle size of the second composite is 0.1-1.0 micron, with an average particle size of 0.4 micron.

EXAMPLE 8

The following example illustrates the ability to alter the morphology of TiC particles produced within an aluminum solvent metal matrix by the addition of a minor amount of $Al_2O_3$ to the starting powder mixture. A composite is produced in a manner similar to Example 5 above, comprising 60 percent TiC second phase particles. However, as opposed to the 40 weight percent Al used in example 5, 35 weight percent Al and 5 weight percent $Al_2O_3$ in the form of fibers is used. The resultant composite is found to comprise 60 weight percent titanium carbide second phase particles and a minor amount of $Al_2O_3$ in a matrix of Al. The TiC particles are of generally disc-like shape, as opposed to spherical, with essentially no interparticle sintering present.

EXAMPLE 9

An experiment is conducted whereby molybdenum disilicide second phase particles are precipitated in an aluminum solvent metal matrix. A mixture of approximately 15.0 percent silicon, 25.0 percent molybdenum, and 60 percent aluminum powders by weight is compacted and subsequently heated in a furnace. On attainment of a temperature of approximately 640° C., a sudden exotherm is noted. Subsequent X-ray and SEM analyses confirm the presence of molybdenum disilicide particles in an aluminum matrix.

EXAMPLE 10

An experiment is conducted whereby zirconium diboride is precipitated in a matrix of copper. A mixture of approximately 34 percent zirconium, 16 percent boron, and 50 percent aluminum powders by weight is compacted, and then heated in a furnace. On attainment of a temperature of 830° C., rapid reaction occurs to a temperature maximum of about 970° C. Subsequent X-ray and SEM analysis shows the presence of zirconium diboride in a copper matrix.

EXAMPLE 11

1,000 grams of composite material, prepared as in Example 10, containing 50 weight percent zirconium diboride second phase in a copper matrix is crushed to minus 16 mesh and then added to 1,000 grams of molten aluminum host metal while mechanically stirring. The resultant composite comprises about 25 weight percent titanium diboride second phase particles in a copper-aluminum alloy matrix.

EXAMPLE 12

A mixture of 20.5 percent titanium, 9.5 percent boron and 70 percent by weight cobalt is isostatically pressed to 40,000 pounds per square inch and heated in a furnace. A highly exothermic reaction occurs at 800° C., with a temperature rise to about 1600° C. Subsequent X-ray analysis identifies the presence of titanium diboride in a cobalt matrix. It is shown here that if sufficient diffusion of the second phase-forming reactants into the solid solvent metal can occur, the initiation temperature can be below the melting point of the solvent metal, which in this case is 495° C., and the reaction may initiate in the solid state.

EXAMPLE 13

A mixture of 16 percent by weight of aluminum, 56 percent by weight of chromium, 20.6 percent by weight titanium, and 9.4 percent by weight of boron is compacted and subsequently heated in a furnace. On attainment of a temperature of about 620° C., a rapid reaction occurs, resulting in a temperature increase to over 800° C. and melting of the chromium. The temperature-time curve shows a double peak, indicating an exothermic reaction in aluminum (which typically occurs between 600°-680° C.) and a subsequent reaction in the chromium. The lower melting solvent metal therefore acts as a "low temperature initiator" for the reaction, which releases heat and induces further reaction in the higher melting solvent metal. The composite produced comprises titanium diboride second phase particles in a matrix of chromium-aluminum alloy.

EXAMPLE 14

A stoichiometric mixture of BN, Ti and Al powders is compacted and heated to ignition at about 730° C., marked by a sudden temperature rise. X-ray and SEM analyses confirm the complete conversion of the BN to $TiB_2$ and TiN at a second phase loading of about 50% by volume. The particle size of the second phase is approximately in the range 1-3 microns.

EXAMPLE 15

A similar experiment to the one described in Example 13 is performed except that Cu is used as the solvent metal. Ignition in copper occurs at about 900° C. Again, X-ray and SEM analyses confirm the conversion of the BN to $TiB_2$ and TiN at a second phase loading of about 70%. The average size of the $TiB_2$ and TiN second phase particles is less than 1 micron.

EXAMPLE 16

Two experiments are performed using $AlB_{12}$, Ti and Al powders to produce a composite comprising $TiB_2$ second phase particles in an Al solvent metal matrix. In one experiment, 26.9 grams of $AlB_{12}$ powder (−200 mesh), 49.3 grams of Ti powder (−325 mesh) and 23.8 grams of Al powder (−325 mesh) are ball milled for 30 minutes, packed in gooch tubing and isostatically pressed to 42,000 psi. The compact is placed on two water cooled copper rails in a quartz tube under flowing argon and inductively heated to initiate an exothermic reaction. Quantitative image, X-ray and SEM analyses of the resultant composite reveal a $TiB_2$ loading of 60 volume percent, with the $TiB_2$ particles having an approximate size range of 0.1–0.5 microns. The particles are single crystals of faceted, equiaxed shape and are substantially unsintered. The second experiment is performed as above except that 20.6 grams of $AlB_{12}$, 36.4 grams of Ti and 43.2 grams of aluminum are used to produce a composite having a 40 volume percent loading of $TiB_2$ in an aluminum matrix. As in the previous experiment, analyses reveal a dispersion of submicron, faceted, equiaxed, single crystal $TiB_2$ particles throughout an aluminum matrix.

EXAMPLE 17

Powders of AlN, Ti and Al in the proper stoichiometric proportions to produce a composite comprising 60 weight percent TiN second phase particles in an aluminum matrix are ball milled and then compacted to 40 ksi. The compact is placed on a water cooled copper boat in a quartz tube under flowing argon and inductively heated to intiate an exothermic reaction. The resultant composite comprises TiN particles of a generally rod-like shape having widths of approximately 1–2 microns and lengths of 5–10 microns dispersed in an aluminum matrix.

EXAMPLE 18

The following example illustrates the formation of titanium vanadium carbide particles of elongated shape within an aluminum matrix. Thirty-seven grams of Ti powder (−100 mesh), 13 grams of V powder (−325 mesh), 10 grams of C power (−325 mesh) and 40 grams of Al powder (−325 mesh) are ball milled and isostatically pressed to 40,000 psi to form a compact. The compact is heated in a radio frequency field to intiate an exothermic reaction. SEM analysis of the resultant composite reveals TiVC particles of elongated shape having widths of approximately 3–5 microns and lengths of approximately 10–80 microns in a matrix of Al.

EXAMPLE 19

The following example illustrates the formation of titanium zirconium carbide particles of elongated shape within an intermetallic containing matrix. Forty-seven grams of $Al_4C_3$ powder, 89 grams of Zr powder and 62 grams of Ti powder are ball milled and isostatically pressed to 40,000 psi to form a compact. The compact is heated in a radio frequency field to initiate an exothermic reaction. SEM analysis of the resultant composite reveals TiZrC particles of elongated shape having widths of approximately 2–4 microns and lengths of approximately 10–40 microns in a matrix containing TiAl.

The following examples 20–22 illustrate the treatment of metal/second phase composites with a dissolution medium to yield fine powders of second phase particles in accordance with the present invention.

EXAMPLE 20

Two composites comprising $TiB_2$ particles within aluminum matrices are prepared in a manner similar to Example 3 above, one having a 40 volume percent loading of $TiB_2$ and the other having a 60 volume percent loading. SEM, TEM, X-ray and quantitative image anaylses of each of the composites reveal dispersions of substantially unsintered, single crystal, equiaxed titanium diboride particles having a size range of 0.5 to 2 microns. One gram of each of the composites is crushed to minus 50 mesh and added to 400 ml of a dissolution medium comprising a 1 molar aqueous solution of HCl. Each mixture is mechanically stirred for 18 hours and then filtered through a 0.2 micron membrane. The material remaining on each membrane is dried in air. SEM, X-ray and quantitative image analyses of each of the materials reveal substantially unsintered, single crystal, equiaxed titanium diboride particles having the same size range (0.5 to 2 microns) as the particles of the composite from which they are obtained.

EXAMPLE 21

Three composites comprising TiC particles within aluminum matrices are prepared in a manner similar to Example 5 above, having 40, 50 and 60 volume percent loadings of TiC. SEM, X-ray and quantitative image analyses of each of the composites reveal dispersions of substantially unsintered, single crystal TiC particles of generally spherical shape. Particle size ranges of 1.5–2.0, 1.4–2.4 and 1.6–1.9 microns are found for each of the 40, 50 and 60 volume percent composites, respectively. One gram of each of the composites is crushed to minus 50 mesh and added to 400 ml of a dissolution medium comprising a 1 molar aqueous solution of HCl. Each mixture is mechanically stirred for 18 hours and then filtered through a 0.2 micron membrane. The material remaining on each membrane is dried in air. In order to determine if the TiC particles of the resultant materials are sintered together, a portion of each filter cake is placed in acetone and ultrasonically agitated for 10 minutes. A glass slide is then dipped into each mixture and dried in air to form a thin coating of TiC powder. SEM, X-ray and quantitative image analyses of each of the powders reveal substantially unsintered, single crystal, spherical titanium carbide particles having the same size range as the particles of the composite from which they were obtained.

EXAMPLE 22

A composite is prepared as in Example 1 above comprising 60 volume percent $TiB_2$ in an aluminum matrix. SEM, X-ray and quantitative image analyses of the composite reveal a dispersion of substantially unsintered, single crystal, equiaxed titanium diboride particles having a size range of 0.1 to 0.5 microns. A one gram piece of the composite is added to 400 ml of a dissolution medium comprising a 1 molar aqueous solution of HCl. The mixture is mechanically stirred for 20 hours and then filtered through a 0.2 micron membrane. The filtrate has a dark grey color, indicating that a substantial portion of the $TiB_2$ particles have passed through the 0.2 micron membrane. SEM analysis of particles removed from the filtrate reveals substantially unsintered, single crystal, equiaxed $TiB_2$ particles having a size range of 0.1 to 0.2 microns. The material remaining on the membrane is dried in air. SEM analysis of the material reveals substantially unsintered, single crystal, equiaxed titanium diboride particles having a size range of 0.2 to 0.5 microns.

While the present invention has been disclosed in conjunction with specific embodiments, it is to be understood that the invention is not limited to the precise disclosure contained herein, but may otherwise be embodied with various changes, modifications and improvements which may occur to those skilled in the art, without departing from the scope of the invention as defined in the appended claims.

We claim:

1. A method for the production of fine second phase powders, the method comprising steps of:
   (a) preparing a mixture comprising powders of reactive second phase-forming reactants and a substantially nonreactive solvent metal in which the second phase-forming reactants are more soluble than the second phase;
   (b) heating the mixture to a reaction initiation temperature approximating the melting point of the solvent metal to initiate an exothermic reaction;
   (c) permitting the exothermic reaction to further heat the mixture, consuming the second phase-forming reactants to form a composite comprising a distribution of second phase particles in a solvent metal matrix;
   (d) substantially separating the second phase particles from the solvent metal matrix; and
   (e) recovering a powder comprising the second phase particles.

2. The method of claim 1, wherein the mixture is compressed to form a compact prior to the heating thereof.

3. The method of claim 2, wherein heating is achieved by bulk heating the compact.

4. The method of claim 2, wherein heating is achieved by igniting a substantially localized portion of the compact.

5. The method of claim 1, wherein the second phase particles are substantially separated from the solvent metal matrix by dissolving the solvent metal in a dissolution medium which is substantially inert with respect to the second phase particles, followed by filtering, centrifuging, decanting, or a combination thereof, to remove the second phase particles from the dissolution medium.

6. The method of claim 5, wherein the dissolution medium is comprised of an aqueous solution of at least one of the following: HCl, HF, $H_2SO_4$, $HNO_3$, $H_2CrO_4$, $H_3PO_4$, NaOH and $NH_4OH$.

7. The method of claim 6, wherein the second phase particles are titanium diboride, titanium carbide, titanium nitride, or a combination thereof, the solvent metal is aluminum, or an alloy thereof, and the dissolution medium is an aqueous solution of hydrochloric acid.

8. The method of claim 5, wherein the second phase particles are dried to yield the second phase powder.

9. The method of claim 1, wherein the second phase particles are substantially separated from the solvent metal by heating the composite above the boiling temperature of the solvent metal matrix to thereby boil off the solvent metal.

10. The method of claim 1, wherein the second phase particles are substantially separated from the solvent metal by heating the composite above the melting temperature of the solvent metal matrix to form a melt in which the second phase particles float, followed by skimming to remove the second phase particles from the melt.

11. The method of claim 1, wherein the second phase particles are substantially separated from the solvent metal by heating the composite above the melting temperature of the solvent metal matrix to form a melt in which the second phase particles settle to the bottom, followed by decanting, centrifuging or a combination thereof to remove the second phase particles from the melt.

12. The method of claim 1, wherein the second phase particles are substantially separated from the solvent metal by heating the composite above the melting temperature of the solvent metal matrix to form a melt in which the second phase particles are rejected to the outer surface, followed by removal of the second phase particles from the melt.

13. The method of claim 1, wherein the second phase is ceramic.

14. The method of claim 1, wherein the second phase is intermetallic.

15. The method of claim 1, wherein the second phase is comprised of materials of plural compositions.

16. The method of claim 1, wherein the second phase-forming reactants are titanium and boron, the solvent metal is aluminum, and the second phase particles are titanium diboride.

17. The method of claim 1, wherein the second phase-forming reactants are titanium and carbon, the solvent metal is aluminum, and the second phase particles are titanium carbide.

18. The method of claim 1, wherein the second phase-forming reactants are titanium and boron, the solvent metal is aluminum, and the second phase particles are titanium diboride, said boron being provided from an aluminum boride compound material.

19. The method of claim 1, wherein the second phase-forming reactants are titanium and nitrogen, the solvent metal is aluminum, and the second phase particles are titanium nitride, said nitrogen being provided from an aluminum nitride compound material.

20. The method of claim 1, wherein the second phase-forming reactants are titanium, boron and nitrogen, the solvent metal is aluminum, and the second phase particles are titanium diboride and titanium nitride, said boron and nitrogen being provided from a boron nitride compound material.

21. The method of claim 1, wherein the mixture includes powder of an additional material which affects the composition, morphology or size of the second phase particles produced.

22. The method of claim 21, wherein the second phase-forming reactants are titanium and carbon, the solvent metal is aluminum, the additional material is aluminum oxide and the second phase particles are essentially titanium carbide.

23. The method of claim 1, wherein prior to separation of the second phase particles from the solvent metal matrix, the composite is heated to a temperature sufficient to melt the solvent metal matrix and is rapidly solidified to form rapidly solidified particles comprising the second phase particles in the solvent metal matrix.

24. The method of claim 1, wherein the second phase particles are in the size range of from about 0.01 to about 10 microns.

25. The method of claim 1, wherein the second phase particles are in the size range of from about 0.1 to about 5 nicrons.

26. The method of claim 1, wherein the second phase particles are substantially single crystals.

27. A method for the production of fine second phase powders, the method comprising steps of:
   (a) preparing a mixture comprising powders of reactive second phase-forming reactants and a substantially nonreactive solvent metal in which the second phase-forming reactants are more soluble than the second phase;

(b) adding the mixture to a molten matrix metal, metal alloy or intermetallic at a temperature at which sufficient diffusion of the second phase-forming reactants into the solvent metal occurs to initiate an exothermic reaction;

(c) permitting the exothermic reaction to further heat the mixture, consuming the second phase-forming reactants to form a composite comprising a distribution of second phase particles in a final metal matrix;

(d) substantially separating the second phase particles from the final metal matrix; and (e) recovering a powder comprising the second phase particles.

28. The method of claim 27, wherein separation of the second phase particles from the final metal matrix is achieved by dissolving the matrix in a dissolution medium, boiling off the matrix, melting the matrix, or a combination thereof.

29. The method of claim 27, wherein prior to separation of the second phase particles from the final metal matrix, the composite is heated to a temperature sufficient to melt the final metal matrix and is rapidly solidified to form rapidly solidified particles comprising the second phase particles in the final metal matrix.

30. A method for the production of the fine second phase powders, the method comprising steps of:

(a) preparing a mixture comprising powders of reactive second phase-forming reactants and a substantially nonreactive solvent metal in which the second phase-forming reactants are more soluble than the second phase;

(b) heating the mixture to a reaction initiation temperature approximating the melting point of the solvent metal to initiate an exothermic reaction;

(c) permitting the exothermic reaction to further heat the mixture, consuming the second phase-forming reactants to form a first composite comprising a distribution of second phase particles in a solvent metal matrix;

(d) introducing the first composite into a host metal to thereby form a second composite comprising particles of the second phase in a final metal matrix comprising an alloy of the solvent metal with the host metal;

(e) substantially separating the second phase particles from the final metal matrix; and (f) recovering a powder comprising the second phase particles.

31. The method of claim 30, wherein the mixture is compressed to form a compact prior to the heating thereof.

32. The method of claim 31, wherein heating is achieved by bulk heating the compact.

33. The method of claim 31, wherein heating is achieved by igniting a substantially localized portion of the compact.

34. The method of claim 30, wherein the first composite is introduced into the host metal by adding the first composite to a molten mass comprising the host metal.

35. The method of claim 30, wherein the first composite is introduced into the host metal by forming a solid mixture comprising the first composite and the host metal, and heating the mixture to a temperature sufficient to form said second composite.

36. The method of claim 30, wherein separation of the second phase particles from the matrix is achieved by dissolving the matrix in a dissolution medium, boiling off the matrix, melting the matrix, or a combination thereof.

37. The method of claim 30, wherein at least one alloying element is introduced into the host metal, which element acts to alter the composition, morphology or size of the second phase particles.

38. The method of claim 30, wherein prior to separation of the second phase particles from the final metal matrix, the second composite is heated to a temperature sufficient to melt the final metal matrix and is rapidly solidified to form rapidly solidified particles comprising the second phase particles in the final metal matrix.

39. A method for the production of fine second phase powders, the method comprising steps of:

(a) preparing a mixture comprising powders of reactive second phase-forming reactants and a first intermetallic precursor in which the second phase-forming reactants are more soluble than the second phase;

(b) heating the mixture to a reaction initiation temperature approximating the melting point of the first intermetallic precursor to initiate an exothermic reaction;

(c) permitting the exothermic reaction to further heat the mixture, consuming the second phase-forming reactants to form a first composite comprising a distribution of second phase particles in a first intermetallic precursor matrix;

(d) introducing the first composite into a second intermetallic precursor to thereby form a second composite comprising particles of the second phase in an intermetallic containing matrix;

(e) substantially separating the second phase particles from the intermetallic containing matrix; and (f) recovering a powder comprising the second phase particles.

40. The method of claim 39, wherein the first composite is introduced into the second intermetallic precursor by adding the first composite to a molten mass comprising the second intermetallic precursor.

41. The method of claim 39, wherein the first composite is introduced into the second intermetallic precursor by forming a solid mixture comprising the first composite and the second intermetallic precursor, and heating the mixture to a temperature sufficient to form said second composite.

42. The method of claim 39, wherein separation of the second phase particles from the intermetallic containing matrix is achieved by dissolving the matrix in a dissolution medium, boiling off the matrix, melting the matrix, or a combination thereof.

43. The method of claim 39, wherein at least one alloying element is introduced into the second intermetallic precursor, which element acts to alter the composition, morphology or size of the second phase particles.

44. The method of claim 39, wherein the second phase particles are selected from the group consisting of metal borides, carbides, oxides, nitrides, silicides, sulfides, and beryllides.

45. A method for the production of powder comprising substantially unsintered second phase particles in a size range of between about 0.01 and 10 microns, the method comprising precipitating particles of at least one second phase material in a solvent metal matrix by contacting second phase-forming reactants, in the presence of a solvent metal in which the second phase-forming reactants are more soluble than the second phase, at a temperature at which sufficient diffusion of the reactants into the solvent metal occurs to cause an exothermic reaction of the reactants, to thereby precipitate particles of the second phase material in a matrix of the solvent metal, substantially separatng the second phase particles from the solvent metal matrix, and recovering said powder.

46. The method of claim 45, wherein the second phase particles are selected from the group consisting of metal borides, carbides, oxides, nitrides, silicides, sulfides, and beryllides.

47. The method of claim 46, wherein the second phase particles are substantially single crystals.

* * * * *